United States Patent
Eberts et al.

(10) Patent No.: US 10,429,866 B2
(45) Date of Patent: Oct. 1, 2019

(54) AUTOMATICALLY RESTARTING A VOLTAGE FOLDBACK CIRCUIT

(71) Applicant: Hamilton Sundstrand Corporation, Charlotte, NC (US)

(72) Inventors: Chris Eberts, Chandler, AZ (US); Anthony Kostura, Gilbert, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/628,873

(22) Filed: Jun. 21, 2017

(65) Prior Publication Data
US 2018/0373282 A1  Dec. 27, 2018

(51) Int. Cl.
| | |
|---|---|
| G05F 1/573 | (2006.01) |
| G05F 1/571 | (2006.01) |
| H02M 1/32 | (2007.01) |
| G05F 1/569 | (2006.01) |
| H02H 3/093 | (2006.01) |
| H03K 17/082 | (2006.01) |
| H03K 17/284 | (2006.01) |

(52) U.S. Cl.
CPC ............ *G05F 1/5735* (2013.01); *G05F 1/571* (2013.01); *G05F 1/573* (2013.01); *G05F 1/569* (2013.01); *H02H 3/093* (2013.01); *H02M 1/32* (2013.01); *H03K 17/0822* (2013.01); *H03K 17/284* (2013.01)

(58) Field of Classification Search
CPC .......... G05F 1/569; G05F 1/571; G05F 1/573; G05F 1/5735; H02M 1/32
See application file for complete search history.

(56) References Cited

U.S. PATENT DOCUMENTS

| | | | |
|---|---|---|---|
| 4,791,544 A | 12/1988 | Gautherin et al. | |
| 5,130,561 A * | 7/1992 | Elliott | H02M 1/14 307/31 |
| 8,018,694 B1 | 9/2011 | Wu | |
| 8,482,894 B2 | 7/2013 | Yra et al. | |
| 2007/0177322 A1 | 8/2007 | Jacobs | |
| 2012/0038394 A1* | 2/2012 | Rice | H03K 5/08 327/114 |
| 2013/0120891 A1 | 5/2013 | Truong et al. | |
| 2013/0335038 A1* | 12/2013 | Lee | H02M 1/126 320/166 |

FOREIGN PATENT DOCUMENTS

| | | |
|---|---|---|
| WO | 9956373 A1 | 11/1999 |
| WO | 2005119777 A1 | 12/2005 |

OTHER PUBLICATIONS

Extended European Search Report, Application No. 18179066.8-1205, dated Nov. 7, 2018, 15 pages.

* cited by examiner

*Primary Examiner* — Fred E Finch, III
*Assistant Examiner* — Rafael O. De León Domenech
(74) *Attorney, Agent, or Firm* — Cantor Colburn LLP

(57) ABSTRACT

Embodiments include techniques for automatically restarting a voltage foldback circuit, the techniques include operating a circuit, and detecting a condition of the circuit. The techniques also include performing a foldback operation based at least in part on the condition of the circuit, subsequently detecting the condition of the circuit. The techniques include initiating a timer of the circuit based at least in part on the subsequent detection of the circuit, and returning the circuit to normal operation based on the timer.

11 Claims, 3 Drawing Sheets

AUTOMATICALLY RESTARTING A VOLTAGE FOLDBACK CIRCUIT

BACKGROUND

Embodiments pertain to the art of protection circuits, and specifically, to a technique for automatically restarting a voltage foldback circuit.

In today's environment, many mechanisms exist that are used for providing protection against overload conditions. Fuses and fuse links provide protection by opening up when a particular threshold is reached. Also, circuit breakers and relays provide circuit protection in a similar manner. Another mechanism that provides protections against overload conditions is foldback circuits which control the output current and voltage instead of disconnecting a load during an overload condition.

Overload conditions can be caused for several reasons including shorted circuit components, an increase in heat dissipation in the circuit, malfunctioning components, etc. It is critical to detect overload conditions and efficiently resolve the overload condition while minimizing the damage caused to the internal circuit and connected loads to return the system back to normal operation to accomplish the mission.

BRIEF DESCRIPTION

Disclosed is a method for automatically restarting a voltage feedback circuit, the method includes operating a circuit, and detecting a condition of the circuit. The method also includes performing a foldback operation based at least in part on the condition of the circuit, subsequently detecting the condition of the circuit. The method includes initiating a timer of the circuit based at least in part on the subsequent detection of the circuit, and returning the circuit to normal operation based on the timer.

Also disclosed is a system for automatically restarting a voltage feedback circuit where the system includes a foldback circuit, the foldback circuit comprises a current limiting circuit, a comparator, and a timer circuit. The comparator is coupled to the current limiting circuit and the timer circuit, wherein the timer circuit is coupled to the current limiting circuit and the comparator through a parallel switch configuration.

BRIEF DESCRIPTION OF THE DRAWINGS

The following descriptions should not be considered limiting in any way. With reference to the accompanying drawings, like elements are numbered alike.

DETAILED DESCRIPTION

Voltage foldback circuits are used in various systems and applications to protect the internal circuits and external loads from overload conditions. A non-limiting example of an overload condition can be caused by a shorted component such as a solenoid which will draw an excessive amount of current. The voltage foldback circuit that is incorporated in the system will provide protection by limiting the output voltage and current supplied to the internal circuits and the load to a level that is well below a harmful level that can damages to the circuit components.

Conventional voltage foldback circuits are not capable of restarting the circuit after an overload condition has been detected until the connected load has been completely removed from the circuit. In the event the overcurrent condition no longer exists and the output voltage and current levels are within normal operating ranges, the load must still be completely removed in order for traditional voltage foldback circuits resume normal operation of a connected load.

The techniques that are described herein use a switch and timer that is coupled to a foldback circuit to reset the foldback circuit and resume the normal operation without having to remove the connected load. This configuration allows the foldback circuit to constantly monitor and protect the internal circuit components and the load while resuming the normal operation after an overload condition no longer exists.

Figure 1:
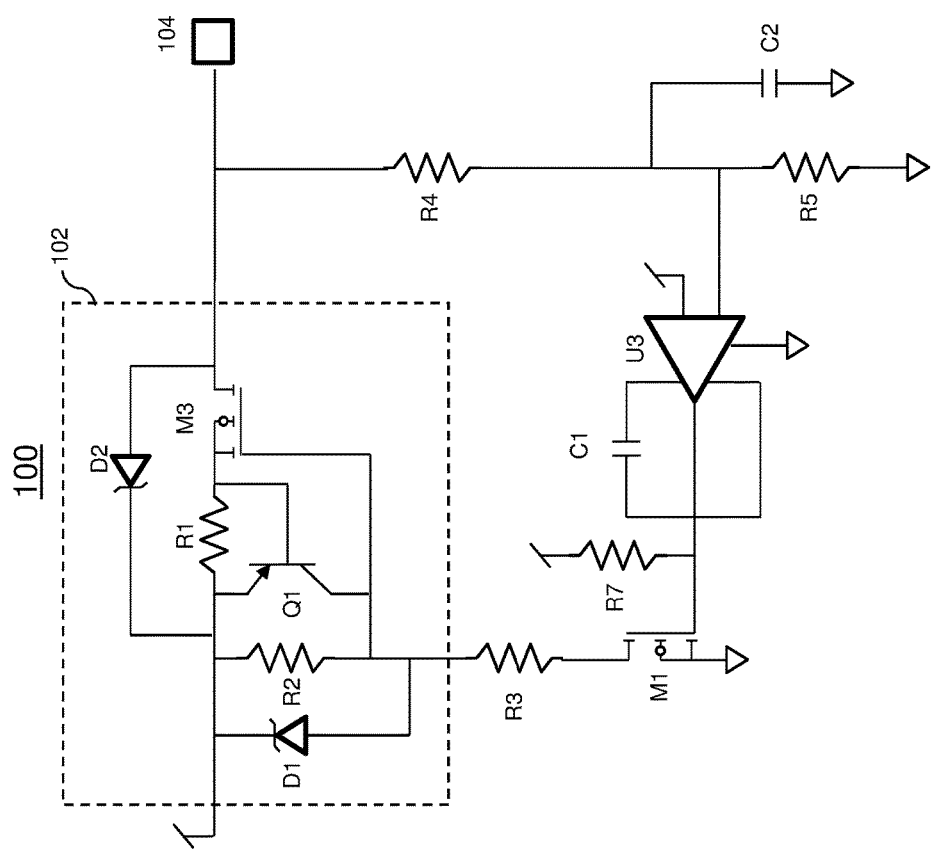
FIG. 1 depicts a block diagram of a prior art system for a voltage feedback circuit.

Now referring to FIG. 1, a prior art foldback circuit 100 is shown. The foldback circuit 100 includes a current limiting circuit 102. The current limiting circuit 102 includes resistors R1, R2, transistors Q1, M3, and diodes D1, D2. The current limiting circuit 102 is configured to limit the maximum current that is supplied to a load 104. The resistors R4, R5 and the capacitor C2 are coupled to the load 104.

The foldback circuit 100 also includes a comparator U3. The comparator U3 is used to determine when an input signal has reached a predetermined value. The comparator U3 is configured to compare the signal coupled to the load 104 with a reference signal. The output of the comparator U3 can output either a high signal or a low signal to the comparator U3 to indicate which of the two input signals is larger. The comparator U3 will output the signal to the transistor M1. If the comparator U3 detects an overload condition, the foldback circuit 100 will reduce the output voltage and the output current provided to the load 104 by triggering the transistor M1. The transistor M1 is coupled to the current limiting circuit 102 through the resistor R3 and coupled to the output of the comparator U3 through the resistor R7 and the capacitor C1.

After the foldback circuit 100 has tripped, the output voltage and current will no longer be supplied to the load 104. Also, because the output voltage remains the at 0 volts after the foldback circuit 100 has tripped the comparator U3 will not be able to change states and restart normal operation of the load 104 in the event the overload condition no longer exists. In other words, because the pinch off level for the voltage has been met, the reset for the foldback circuit 100 is held in position until the load 104 and the leakage from the other components is completely removed. Once the load 104 has been completely removed and disconnected from the system, the circuit 100 can return to normal operation having the operating output voltage and output current supplied to the load 104.

Figure 2:
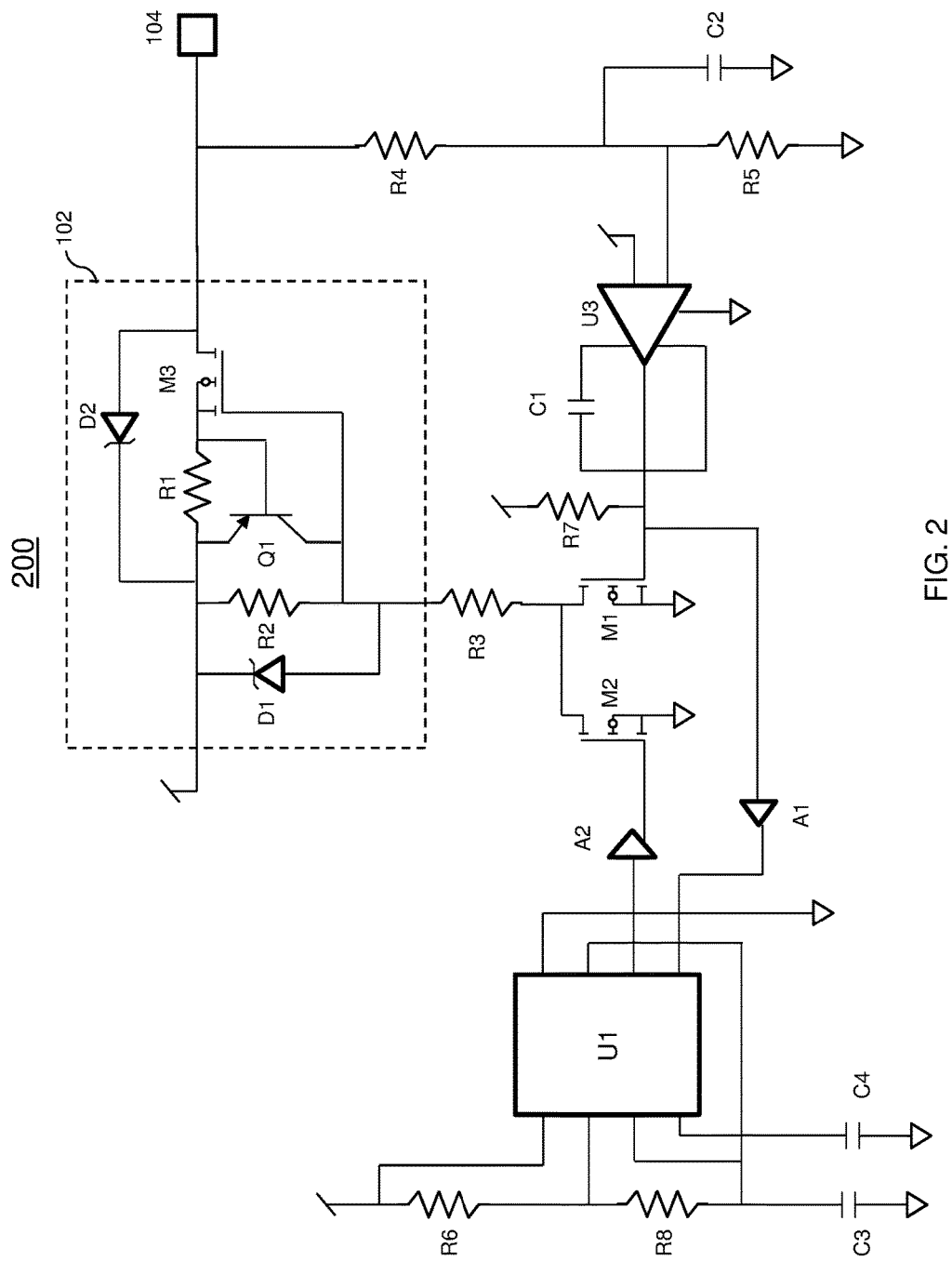
FIG. 2 depicts a block diagram of a system for automatically restarting a voltage feedback circuit in accordance with one or more embodiments.

Now referring to FIG. 2, a system 200 for automatically restarting a voltage foldback circuit in accordance with one or more embodiments is shown. A current limiting circuit 102 can be incorporated into the system 100. In one or more embodiments, the current limiting circuit 102 can include the components as shown in FIG. 2. In other embodiments, a different configuration for implementing a current limiting circuit 102 can be used. As the load 104 demands more and more power, a lower voltage will be realized at the output due to the current being restricted by the current limiting circuit 102. After the output voltage of the load 104 reaches a threshold the comparator U3 will shut off the output voltage supplied to the load and there will be no current or voltage supplied to the load 104.

The system 200 includes a timer circuit U1, where the timer circuit U1 includes several inputs and outputs. The timer circuit U1 is coupled to relays A1, A2. The relay A1 is coupled to the output of the comparator U3 and is coupled to the reset RST input of the timer circuit U1. When the system 200 is operating within a normal operating range (not an overload condition), the timer circuit U1 is held in the reset state. When the system 200 is detected to be in an overload condition, the timer circuit U1 is enabled and will be activated. After a configurable delay, the timer circuit U1 outputs a pulse signal to the relay A2 which is coupled to the transistor M2 to reset the system 200.

After the pulse is applied to the transistor M2, the system 200 will detect whether the system is still under an overload/overcurrent condition at the current limiting circuit 102. If so, the output voltage and current will remain folded back. If the system 200 is no longer in the overload/overcurrent condition and is operating within the normal operating ranges, the system 200 will be able to resume normal operation without having to remove the load 104.

The timer circuit U1 is also coupled to resistors R6, R8 and capacitors C3, C4. In one or more embodiments, the switches M1, M2 is a low side switch. The low side switch is on the low side of the circuit. In other embodiments, high side switches can be used. In an embodiment, the switches M1, M2 can be positioned in a parallel configuration.

In one or more embodiments, the timer circuit U1 is an NE555 timer. After the duration associated with the timer has elapsed, the timer U1 will send out a pulse and attempt to activate the system 200 and allow the voltage to be supplied to the load 104. In the event the overcurrent condition is still present, the current limiting circuit 102 will shut off again and attempt to restart the normal operation of the circuit during the next period. In one or more embodiments, the timer U1 can be configured to provide various delays.

In the event the overcurrent condition is no longer present, the normal operation of the circuit and load 104 can resume. The current limiting circuit 102 will also resume protecting the system 200 by detecting the current and limiting the output voltage provided to the load.

Figure 3:
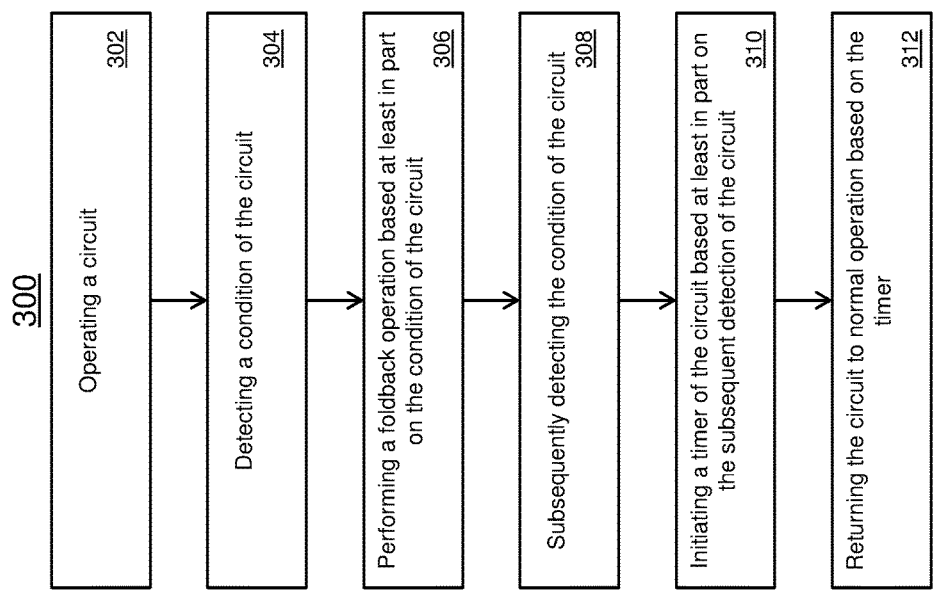
FIG. 3 depicts a method for automatically restarting a voltage feedback circuit in accordance with one or more embodiments.

Now referring to FIG. 3, a method 300 for automatically restarting a voltage foldback circuit in accordance with one or more embodiments is shown. Block 302 provides operating a circuit. In one or more embodiments, the circuit is coupled to a load and operated within its normal operating range. The normal operating range is a condition where the circuit is supplying a load that is not in an overload, overcurrent, or malfunctioning condition.

Block 304 provides detecting a condition of the circuit. In one or more embodiments, the circuit includes a foldback circuit. The foldback circuit can detect the output voltage and current that is supplied to a load. The foldback circuit is configured to provide protection to the internal components and external components connected to the circuit.

Block 306 provides performing a foldback operation based at least in part on the condition of the circuit. In the event a harmful condition is detected, the foldback circuit can provide protection by reducing the output voltage and current to safe levels. The foldback circuit can detect when the output voltage is approaching the harmful condition but does not trip the foldback circuit until a threshold has been reached.

Block 308 provides subsequently detecting the condition of the circuit. After the foldback operation has started, the foldback circuit constantly detects the condition of the circuit to determine whether the circuit has reached the threshold indicating an overcurrent condition. If not, the circuit resumes normal operation until the threshold is reached. If the threshold has been reached, the foldback circuit reduces the output voltage and threshold to safe levels.

Block 310 provides initiating a timer of the circuit based at least in part on the subsequent detection of the circuit. In one or more embodiments, the timer is enabled based on the foldback circuit determining the threshold indicating an overcurrent condition has been detected. This condition can be detected by a comparator in the circuit, where the comparator compares an output voltage signal to a reference signal in the circuit. If the threshold has not been reached, the timer remains in the reset state and is not initiated.

In the event the threshold has been reached, the timer will be initiated and periodically sends out pulse signals. The pulse signal is used to restart the circuit and is configured by the delay of the timer. Responsive to each pulse signal being sent by the timer, another detection of the condition of the circuit is performed. In one or more embodiments, the current limiting circuit of the foldback circuit can perform the detection and determine whether the overcurrent condition still exists. If the overcurrent condition no longer exists, the circuit will return to normal operation based on performing the detection and the pulse signal of the timer will be disabled.

Block 312 provides returning the circuit to normal operation. In one or more embodiments, the load does not have to be removed in order to return the circuit to normal operation upon detecting the circuit is no longer in an overcurrent condition. After the overcurrent condition is no longer detected, the timer returns to the reset state and stops sending out pulse signals to restart the circuit. The foldback circuit continues to monitor the condition of the circuit to detect a subsequent overload condition.

The techniques described herein provide a mechanism for automatically restarting the voltage foldback circuit when the output current and voltage fall within normal operating ranges after an overcurrent condition is removed. This technique allows for the constant protection of the system circuitry and load.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to one or more embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of automatically restarting a voltage foldback circuit, the method comprises:
   operating a circuit;
   detecting a condition of the circuit;
   performing a foldback operation based at least in part on the condition of the circuit;
   subsequently detecting the condition of the circuit;
   initiating a timer of the circuit based at least in part on the subsequent detection of the circuit, wherein the timer periodically provides pulses to the circuit if the subsequent detection indicates an overload condition is not removed, wherein the timer is coupled to a current limiting circuit and an output of the comparator via a set of parallel switches, wherein an output of the timer is provided to a first switch of the set of parallel switches, wherein the set of parallel switches are low side switches, the first switch of the parallel switches is connected to and controlled by the timer, wherein the timer receives an output of the comparator, wherein a second switch of the parallel switches is connected to and controlled by the comparator; and
   returning the circuit to normal operation based on the timer, wherein returning the circuit to the normal operation occurs while maintaining a load being coupled to the circuit.

2. The method of claim 1, wherein the initiating the timer is based on the detection indicating an overcurrent condition.

3. The method of claim 1, further comprises responsive to initiating the timer, the timer periodically sends out a pulse signal to return the circuit to normal operation.

4. The method of claim 3, further comprises responsive to each pulse being sent by the timer, performing another detection of the condition of the circuit;
   returning the circuit to normal operation based at least in part on performing another detection; and
   disabling the timer, responsive to the returning the circuit to normal operation.

5. The method of claim 1, wherein if an overload condition is removed the pulse from the timer restarts the circuit.

6. The method of claim 1, wherein the timer is an NE555 timer.

7. A system for automatically restarting a voltage feedback circuit, the system comprises:
   a foldback circuit, the foldback circuit comprises a current limiting circuit;
   a comparator, the comparator is coupled to the current limiting circuit and a timer circuit, wherein the timer circuit is coupled to the current limiting circuit and an output of the comparator via a set of parallel switches, wherein the set of parallel switches are low side switches, wherein the timer circuit periodically provides pulses to the voltage feedback circuit if a detection indicates an overload condition is not removed, wherein pulses return the voltage feedback circuit to normal operation while maintaining a load being coupled to the voltage feedback circuit, wherein an output of the timer circuit is provided to a first switch of the set of parallel switches, the first switch of the set of parallel switches is connected to and controlled by the timer circuit, wherein the timer circuit receives an output of the comparator, wherein a second switch of the parallel switches is connected to and controlled by the comparator.

8. The system of claim 7, wherein the timer circuit is an NE555 timer.

9. The system of claim 7, wherein the timer circuit provides a pulse to activate the foldback circuit.

10. The system of claim 7, wherein the timer circuit is enabled by an output of the comparator.

11. The system of claim 7, wherein the timer circuit is coupled to the switch via a buffer, wherein the relay receives a pulse signal.

* * * * *